(12) United States Patent
Yamazaki et al.

(10) Patent No.: US 7,019,718 B2
(45) Date of Patent: Mar. 28, 2006

(54) DISPLAY DEVICE

(75) Inventors: Shunpei Yamazaki, Tokyo (JP); Jun Koyama, Kanagawa (JP); Mitsuaki Osame, Kanagawa (JP); Kazutaka Inukai, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 620 days.

(21) Appl. No.: 09/908,654

(22) Filed: Jul. 20, 2001

(65) Prior Publication Data

US 2002/0011975 A1    Jan. 31, 2002

(30) Foreign Application Priority Data

Jul. 25, 2000    (JP) .............................. 2000-223488

(51) Int. Cl.
*G09G 3/30* (2006.01)

(52) U.S. Cl. .............................. 345/80; 345/76; 345/84; 345/87; 349/139; 349/153

(58) Field of Classification Search .................. 345/76, 345/80, 82, 84, 87; 349/139, 148, 153
See application file for complete search history.

(56) References Cited

U.S. PATENT DOCUMENTS

| | | | |
|---|---|---|---|
| 5,076,667 A * | 12/1991 | Stewart et al. ............... | 349/139 |
| 5,148,301 A * | 9/1992 | Sawatsubashi et al. ...... | 349/153 |
| 5,327,267 A * | 7/1994 | Aoki et al. ................... | 349/40 |
| 5,684,555 A * | 11/1997 | Shiba et al. .................. | 349/149 |
| 6,011,607 A | 1/2000 | Yamazaki et al. | |
| 6,124,904 A * | 9/2000 | Sato ............................. | 349/43 |
| 6,194,837 B1 | 2/2001 | Ozawa | |
| 6,211,931 B1 * | 4/2001 | Fukao et al. .................. | 349/86 |
| 6,239,854 B1 * | 5/2001 | Hirakata et al. ............. | 349/149 |
| 6,262,702 B1 | 7/2001 | Murade | |
| 6,355,942 B1 | 3/2002 | Yamazaki et al. | |
| 6,400,426 B1 * | 6/2002 | Yamazaki et al. ............. | 349/43 |
| 6,404,414 B1 | 6/2002 | Ishii | |
| 2001/0015626 A1 | 8/2001 | Ozawa | |
| 2001/0022572 A1 | 9/2001 | Murade | |

(Continued)

FOREIGN PATENT DOCUMENTS

EP    0 932 137 A1    7/1999

(Continued)

OTHER PUBLICATIONS

International Search Report (Application No. 01118047.8) Sep. 14, 2004, 4 pages.

(Continued)

*Primary Examiner*—Ricardo Osorio
*Assistant Examiner*—Tom Sheng
(74) *Attorney, Agent, or Firm*—Fish & Richardson P.C.

(57) ABSTRACT

A display device is reduced in size. Wiring lines are formed in a portion of a pixel substrate which is covered with a sealing member. The width of each of the wiring lines is set to a width that allows the sealing member on the wiring lines sufficient exposure to ultraviolet rays when the sealing member is irradiated with ultraviolet rays through the wiring lines. Instead of using one wide wiring line, a plurality of wiring lines each having a small width are connected in parallel to one another. The area the wiring lines around a pixel portion and a driving circuit occupy and the area the sealing member occupies are thus reduced in the display device, whereby the display device can be made smaller.

36 Claims, 10 Drawing Sheets

U.S. PATENT DOCUMENTS

2001/0033264 A1  10/2001  Ishii
2002/0056844 A1  5/2002  Yamazaki et al.
2004/0141139 A1  7/2004  Yamazaki et al.

FOREIGN PATENT DOCUMENTS

| EP | 0 950 917 A1 | 10/1999 |
|---|---|---|
| JP | 11-024588 | 1/1999 |
| JP | 11-052394 | 2/1999 |
| WO | WO98-43130 | 10/1998 |

OTHER PUBLICATIONS

European Communication and Search Report dated Feb. 8, 2005 (Application No. 01118047.8), 7 pages.

* cited by examiner

DISPLAY DEVICE

BACKGROUND OF THE INVENTION

1. Field of the Invention

The present invention relates to a display device having a sealing structure. Specifically, the invention relates to an active matrix display device using a semiconductor element (an element formed of a semiconductor thin film) and to electronic equipment employing the active matrix display device as its display unit.

2. Description of the Related Art

An electro-optical device such as an EL display device having an EL element has lately been attracting attention as a flat display.

The EL element has a structure in which an EL layer is sandwiched between a pair of electrodes (an anode and a cathode). The EL layer generally takes a laminate structure. A typical example of the laminate structure is the one proposed by Tang et al. of Eastman Kodak Company, and consists of a hole transportation layer, a light emitting layer and an electron transportation layer. This structure has so high a light emission efficiency that it is employed in almost all of EL display devices that are under development at present.

Other examples of the EL layer laminate structure include a structure consisting of a hole injection layer, a hole transportation layer, a light emitting layer, and an electron transportation layer which are layered in this order on an anode, and a structure consisting of a hole injection layer, a hole transportation layer, a light emitting layer, an electron transportation layer, and an electron injection layer which are layered in this order on an anode. The light emitting layer may be doped with a fluorescent pigment or the like.

In this specification, all of the layers provided between a cathode and an anode are collectively called an EL layer. Accordingly, the hole injection layer, a hole transportation layer, a light emitting layer, an electron transportation layer, an electron injection layer, etc. mentioned above are all included in the EL layer.

A given voltage is applied to the EL layer structured as above from the pair of electrodes, whereby recombination of carriers takes place in the light emitting layer to emit light. An EL element emitting light is referred to herein as EL element being driven. The EL element in this specification refers to a light emitting element composed of an anode, an EL layer, and a cathode.

The EL element in this specification refers to both a light emitting element that utilizes light emission from a singlet exciton (fluorescence) and a light emitting element that utilizes light emission from a triplet exciton (phosphorescence).

An active matrix structure is given as one of structures for EL display devices.

FIG. 9 shows an example of the structure of a pixel portion in an active matrix EL display device. In the active matrix EL display device, each pixel has thin film transistors (hereinafter referred to as TFTs). Each pixel has a switching TFT 901 whose gate electrode is connected to one of gate signal lines (G1 to Gy) for inputting a selection signal from a gate signal line driving circuit. The switching TFT 901 in each pixel has a source region and a drain region one of which is connected to one of source signal lines (S1 to Sx) for inputting a signal from a source signal line driving circuit and the other of which is connected to a gate electrode of an EL driving TFT 902 and to one of electrodes of a capacitor 903 that is provided in each pixel. The other electrode of the capacitor 903 is connected to one of power supply lines (V1 to Vx). The EL driving TFT 902 provided in each pixel has a source region and a drain region one of which is connected to one of the power supply lines (V1 to Vx) and the other of which is connected to an EL element 904 that is provided in each pixel.

When the gate signal line driving circuit selects the gate signal line GI and inputs a signal, the switching TFT 901 that is connected to the gate signal line G1 is turned ON. If the source signal line driving circuit inputs a signal to the source signal lines Si to Sx at this point, the EL driving TFT 902 is turned ON in every pixel to which the signal is inputted. Thus a current flows into the EL element 904 from its associated power supply line (one of V1 to Vx), causing the EL element 904 to emit light. This operation is repeated for all of the gate signal lines G1 to Gy to display an image.

The EL element 904 has an anode, a cathode, and an EL layer that is provided between the anode and the cathode. If the anode of the EL element 904 is connected to the source region or the drain region of the EL driving TFT 902, the anode of the EL element 904 serves as a pixel electrode whereas the cathode thereof serves as an opposite electrode. On the other hand, if the cathode of the EL element 904 is connected to the source region or the drain region of the EL driving TFT 902, the cathode of the EL element 904 serves as the pixel electrode whereas the anode thereof serves as the opposite electrode.

The electric potential of the opposite electrode is called herein as an opposite electric potential. A power supply for giving the opposite electric potential to the opposite electrode is called an opposite power supply. The electric potential difference between the electric potential of the pixel electrode and the electric potential of the opposite electrode corresponds to an EL driving voltage, which is applied to the EL layer.

An organic EL layer has a problem of being degraded by moisture or oxygen. For that reason, it is common to seal the device after the EL layer is formed by a UV-curable resin in a nitrogen atmosphere instead of exposing the device to the air. FIGS. 4A and 4B show an example of sealing the EL display device.

FIG. 4A is a top view of the EL display device. A pixel portion 402 having EL elements, a gate signal line driving circuit 403, and a source signal line driving circuit 404 are formed on an insulating substrate 41. A sealing member 401 is formed on the insulating substrate 41 so as to surround the pixel portion 402, the gate signal line driving circuit 403 and the source signal line driving circuit 404. At this point, an opening (not shown) is formed as an inlet for injecting a filer 43 later. Then a spacer (not shown) is sprayed to bond a covering member 42. After the sealing member 401 is cured by irradiation of ultraviolet rays, the filler 43 is filled in a region enclosed with the covering member 42 and the sealing member 401. The inlet for the filler 43 is then sealed by an end-sealing material (not shown).

FIG. 4B is a sectional view taken along the line A–A' in FIG. 4A.

In order to simplify the illustration, components shown in FIG. 4B are limited to a TFT 413 constituting the gate signal line driving circuit 403, and an EL driving TFT 414 and an EL element 417 which constitute the pixel portion 402. The insulating substrate 41 is referred to as pixel substrate. The EL element 417 is composed of a pixel electrode 407, an EL layer 416, and an opposite electrode 408. The covering member 42 is set in place by the sealing member 401. The filler 43 is sealed in a space between the pixel substrate 41 and the covering member 42. A hygroscopic substance (not shown) is added to the filler 43. In this way, degradation of the EL element 417 due to moisture is avoided.

Denoted by 406 is a gate insulating film for the TFT 413 and for the EL driving TFT 414, and 415 denotes an interlayer insulating film.

A signal to be inputted to the pixel portion 402, the gate signal line driving circuit 403, and the source signal line driving circuit 404 is inputted through wiring lines 412 (412a to 412c) from an FPC (flexible printed circuit) substrate 410 (see FIG. 4A). The wiring lines 412 run between the pixel substrate 41 and the sealing member 401 to connect the FPC substrate 410 with the driving circuits. The FPC substrate 410 is connected at an external input terminal 409 to the wiring lines 412 through an anisotropic conductive film (not shown).

Any EL display device has to seal its EL element by bonding a pixel substrate to a covering member using a sealing member in order to prevent degradation of the EL element.

Unlike the pixel portion, portions where the sealing member and the driving circuits are formed do not display an image. In conventional display devices, these portions that are not used to display an image occupy a great proportion to hinder the display devices from reducing their sizes.

SUMMARY OF THE INVENTION

The present invention has been made in view of the above and an object of the present invention is therefore to reduce the area of portions other than a pixel portion in a display device.

To attain the object, wiring lines are formed in a portion of a pixel substrate which is covered with a sealing member. The width of each of the wiring lines is set to a width that allows the sealing member on the wiring lines to be sufficiently exposed to ultraviolet rays when the sealing member is irradiated with ultraviolet rays through the wiring lines.

The area where the wiring lines around the pixel portion and the driving circuits occupy and the area where the sealing member occupies are thus reduced in the display device, whereby the display device can be made smaller.

The structure of the present invention will be described hereinbelow.

According to the present invention, there is provided a display device comprising a substrate, a covering member, and a sealing member, the substrate having a plurality of pixels and a driving circuit formed thereon, the driving circuit inputting a signal to the plural pixels, the plural pixels each having an EL element, the covering member having a light-shielding property, the sealing member including a UV-curable material, the sealing member surrounding the plural pixels and the driving circuit on the substrate, the substrate being adhered to the covering member with the sealing member sandwiched therebetween to seal the EL element, characterized in that first wiring lines are formed between the sealing member and the substrate, and wherein the first wiring lines each have a plurality of second wiring lines connected in parallel to one another.

The display device may be a display device characterized in that an inorganic material is used to form a portion of the substrate which comes into contact with the sealing member.

According to the present invention, there is provided a display device comprising a first substrate, a second substrate, and a sealing member, the first substrate having a plurality of pixels and a driving circuit formed thereon, the driving circuit inputting a signal to the plural pixels, the second substrate having a light-shielding property, the sealing member including a UV-curable material, the sealing member surrounding the plural pixels and the driving circuit on the first substrate, the first substrate being adhered to the second substrate with the sealing member sandwiched therebetween so that a liquid crystal is injected and sealed in a region enclosed by the first substrate, the second substrate, and the sealing member, characterized in that: first wiring lines are formed between the sealing member and the substrate; and that the first wiring line each have a plurality of second wiring lines connected in parallel to one another.

The display device may be a display device characterized in that an inorganic material is used to form a portion of the first substrate which comes into contact with the sealing member.

The display device may be a display device characterized in that the width of each of the plural second wiring lines connected in parallel to one another is given as L whereas the spacing between adjacent lines in the plural second wiring lines connected in parallel to one another is given as S, and the ratio of L to S (L/S) is 0.7 to 1.5.

The display device may be a display device characterized in that the width of each of the plural second wiring lines connected in parallel to one another, given as L, is 100 μm to 200 μm, and that the spacing between adjacent lines in the plural second wiring lines connected in parallel to one another, given as S, is 50 μm to 150 μm.

The display device may be a display device characterized in that the wiring lines are formed from the same material that is used to form source wiring lines and drain wiring lines of TFTs for the plural pixels and for the driving circuit.

According to the present invention, there is provided a display device comprising a plurality of pixels and a plurality of external input terminals which are formed on a substrate, the plural pixels having EL elements, characterized in that anode lines for supplying current to the EL elements are connected to the plural external input terminals.

According to the present invention, there is provided a display device comprising a plurality of pixels and a plurality of external input terminals which are formed on a substrate, the plural pixels having EL elements, characterized in that cathode lines for leading current out of the EL elements are connected to the plural external input terminals.

The display device may be a display device characterized in that at least one of the plural external input terminals is near one end of a longer side of the substrate, and the rest of the external input terminals are near the other end of the longer side of the substrate.

The display device may be a display device characterized in that at least one of the plural external input terminals is connected to a first FPC substrate and the rest of the plural external input terminals are connected to a second FPC substrate.

The display device may be a display device characterized in that the plural external input terminals are distanced from one another by equal to or more than half the length of the longer side of the substrate.

According to the present invention, there is provided a display device comprising: a substrate; first wiring lines and a plurality of pixels which are formed on the substrate; a covering member having a light-shielding property; and a sealing member, characterized in that:

the plural pixels formed on the substrate are sealed by the sealing member and the covering member;

the first wiring lines are covered with the sealing member;

the sealing member includes a UV-curable material; and the first wiring lines each have a plurality of second wiring lines connected in parallel to one another.

According to the present invention, there is provided a display device comprising: a substrate; first wiring lines and a plurality of pixels which are formed on the substrate; a covering member having a light-shielding property; and a sealing member, characterized in that:

the plural pixels formed on the substrate are sealed by the sealing member and the covering member;

the plural pixels each have an EL element;

the first wiring lines are covered with the sealing member;

the sealing member includes a UV-curable material; and the first wiring lines each have a plurality of second wiring lines connected in parallel to one another.

According to the present invention, there is provided a display device comprising: a substrate; first wiring lines and a plurality of pixels which are formed on the substrate; a covering member having a light-shielding property; a sealing member; and a liquid crystal, characterized in that:

the plural pixels formed on the substrate and the liquid crystal are sealed by the sealing member and the covering member;

the first wiring lines are covered with the sealing member;

the sealing member includes a UV-curable material; and the first wiring lines each have a plurality of second wiring lines connected in parallel to one another.

The present invention may be a video camera, an image reproducing device, a head mounted display, a cellular phone, or a portable information terminal, in which the above-mentioned display device is used therein.

DETAILED DESCRIPTION OF THE PREFERRED EMBODIMENTS

An embodiment mode of the present invention will be described with reference to FIGS. 1A and 1B.

The description given here is about an EL display device with wiring lines formed in a portion of a pixel substrate which is covered with a sealing member. In this specification, the portion of the pixel substrate which is covered with the sealing member is called a sealed region.

Figure 1A:
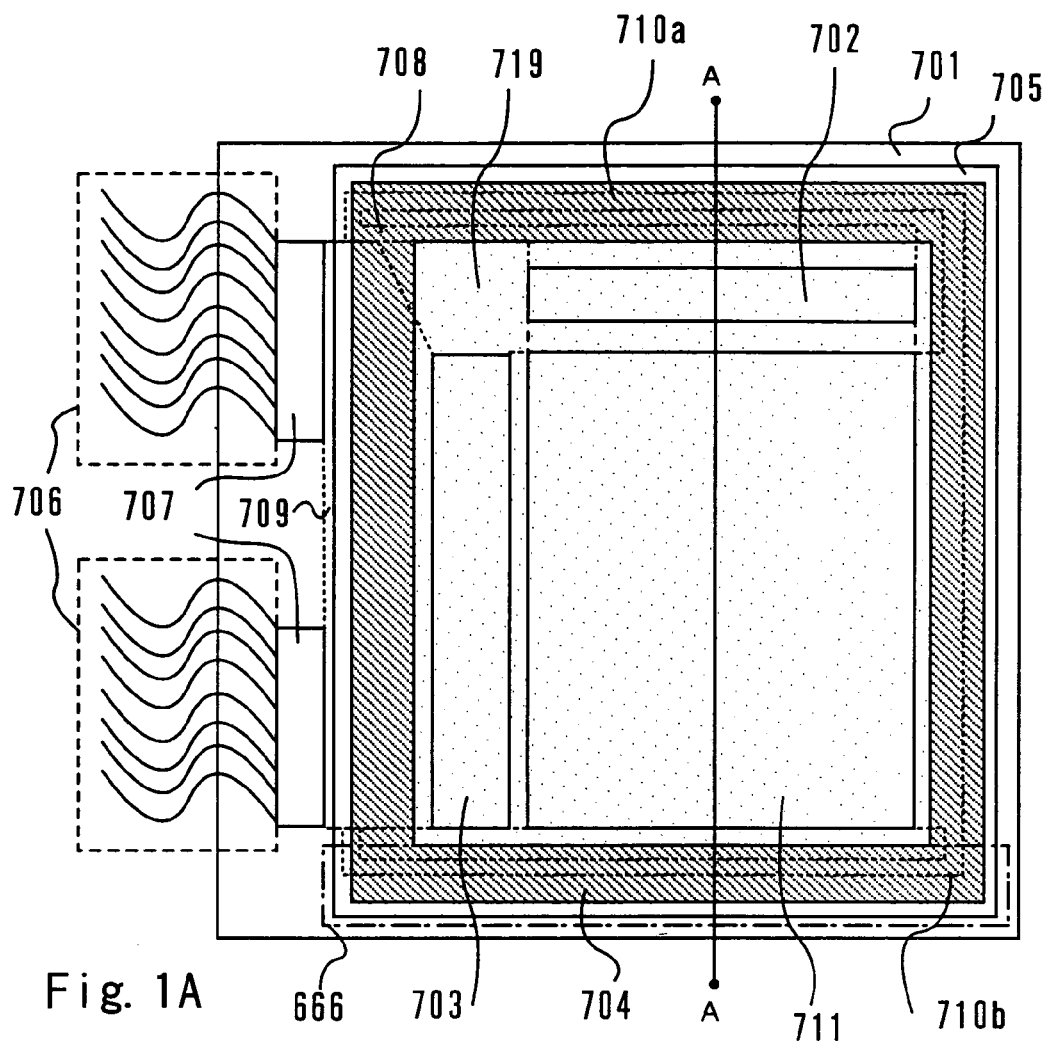
FIGS. 1A and 1B are a top view of an EL display device according to the present invention and a sectional view thereof, respectively.

FIG. 1A shows a top view of an EL display device according to the present invention. On a pixel substrate 701, a pixel portion 711, a gate signal line driving circuit 702, and a source signal line driving circuit 703 are formed. A sealing member 704 is formed surrounding the pixel portion and the driving circuits, so that a covering member 705 is bonded by the sealing member. FPC substrates 706 are connected to the top face of the pixel substrate 701 by external input terminals 707. Wiring lines 708 are a plurality of wiring lines such as signal lines and power supply lines, which receive signals from the FPC substrates 706 through the external input terminals 707 to transmit the signals to the gate signal line driving circuit 702. Wiring lines 709 are a plurality of wiring lines such as signal lines and power supply lines, which receive signals from the FPC substrates 706 through the external input terminals 707 to transmit the signals to the source signal line driving circuit 703. Wiring lines 710 (wiring lines 710a and wiring lines 710b) are a plurality of wiring lines such as power supply lines, which receive signals from the FPC substrates 706 through the external input terminals 707 to transmit the signals to the pixel portion 711. The wiring lines 708 to 710 are formed in the sealed region.

Figure 1B:
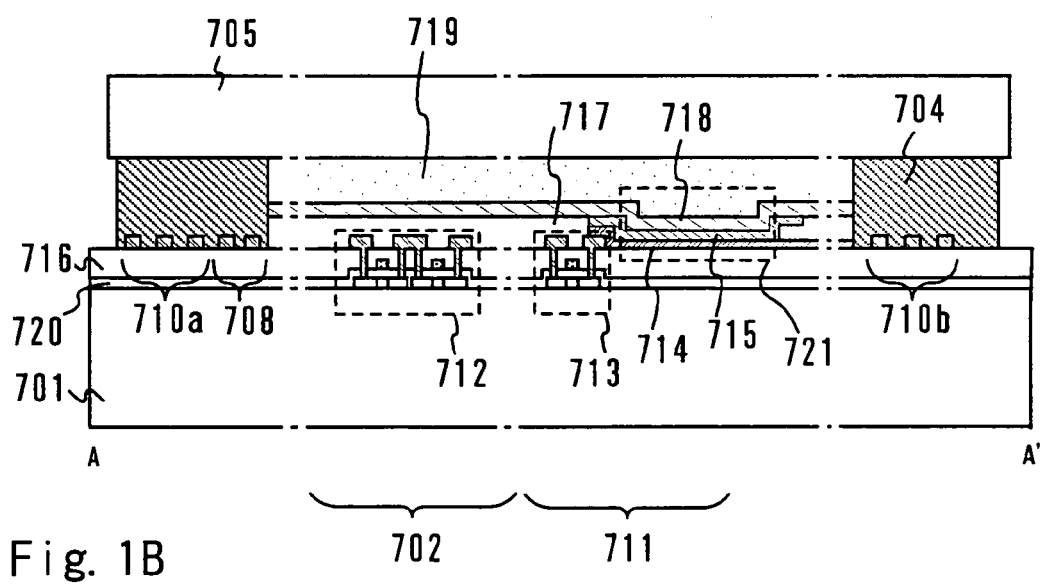

FIG. 1B is a sectional view taken along the line A–A' in FIG. 1A.

In order to simplify the illustration, components shown in FIG. 1B are limited to a TFT 712 as an element constituting the gate signal line driving circuit 702, and an EL driving TFT 713 and an EL element 721 as elements that constitute the pixel portion 711. Either a source region of the EL driving TFT 713 or a drain region thereof is connected to a pixel electrode 714 of the EL element 721 in order to control a current flowing into the EL element 721. Denoted by 716 in FIG. 1B is an interlayer insulating film, 715, an EL layer, 717, an insulating film, 718, an opposite electrode, 719, a filler, and 720, a gate insulating film. The interlayer insulating film 716 is formed of an inorganic material here.

The wiring lines 708 and the wiring lines 710a and 710b are formed from the same material that is used to form source wiring lines and drain wiring lines of the TFT 712 and of the EL driving TFT 713.

Of the wiring lines 708 to 710, explanations of the wiring lines 709 are omitted because the wiring lines 709 are formed in the same way as the wiring lines 708 and the wiring lines 710a and 710b.

The sealing member 704 is often formed from a UV-curable material. A material often used for the covering member 705 is a material having a light-shielding property. Therefore the sealing member 704 cannot be exposed and cured when the sealing member 704 is irradiated with ultraviolet rays from the covering member 705 side. Thus the irradiation of ultraviolet rays has to be made from the pixel substrate 701 side through the wiring lines 708 and the wiring lines 710a and 710b to expose the sealing member 704.

Of the wiring lines 708 and the wiring lines 710a and 710b, wiring lines having a narrower width are used as video signal lines and pulse lines. On the other hand, power supply lines for supplying current to power supply lines for the pixel portion and power supply lines for the source signal line driving circuit and the gate signal line driving circuit have to be wiring lines having a width greater than the video signal lines and the pulse lines because a voltage inputted to these power supply lines is larger than a voltage inputted to the video signal lines and the pulse lines.

However, wiring lines having a large width is an obstacle when irradiating the sealing member with ultraviolet rays through the wiring lines, for the sealing member under the shade of the wiring lines is not irradiated with a sufficient amount of ultraviolet rays. Then there is a possibility is that the sealing member is not cured satisfactorily.

Figure 3A:
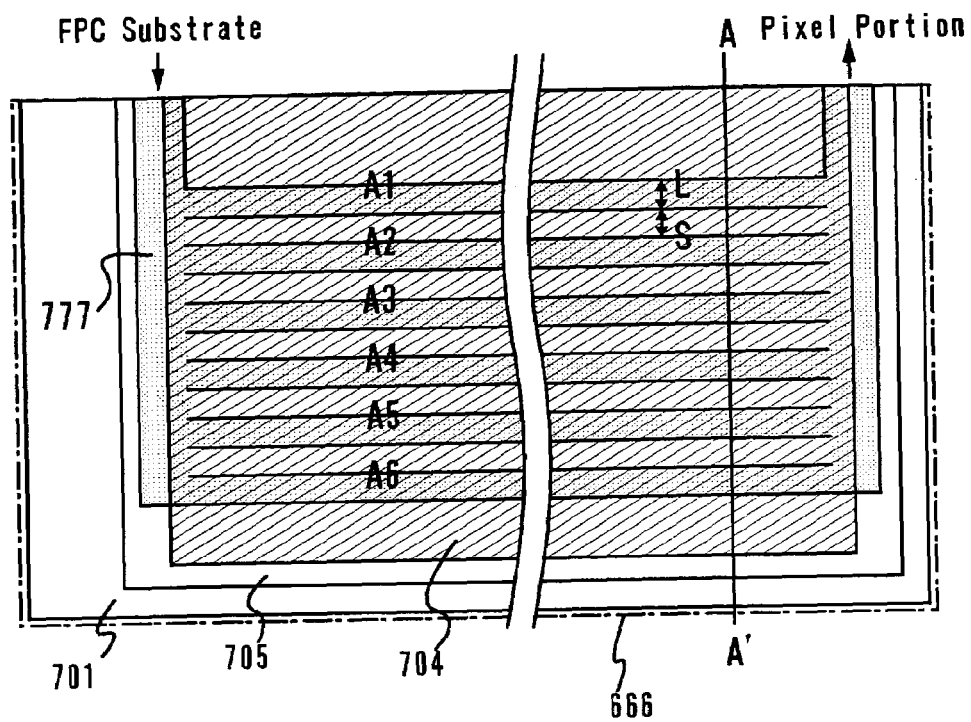
FIGS. 3A and 3B are diagrams showing the configuration of wiring lines for a display device according to the present invention.

The present invention therefore provides wiring lines having the following configuration. A schematic diagram of the configuration is shown in FIG. 3A. FIG. 3A corresponds to an enlarged view of a part of the sealed region in FIGS. 1A and 1B, and the part is denoted by 666.

FIG. 3A focuses on one power supply line 777 out of the wiring lines (first wiring lines) 710b. The power supply line 777 is composed of wiring lines (second wiring lines) A1 to A6 connected in parallel to one another. Now, a description is given to the case where the sealing member 704 is irradiated with ultraviolet rays through the wiring line 777 configured as above.

Although the one power supply line 777 here is composed of six wiring lines A1 to A6 connected in parallel to one another, the present invention is not limited thereto. To generalize, one wiring line may be composed of n (n is a natural number equal to or greater than 2) wiring lines (second wiring lines) A1 to An connected in parallel to one another.

Figure 3B:
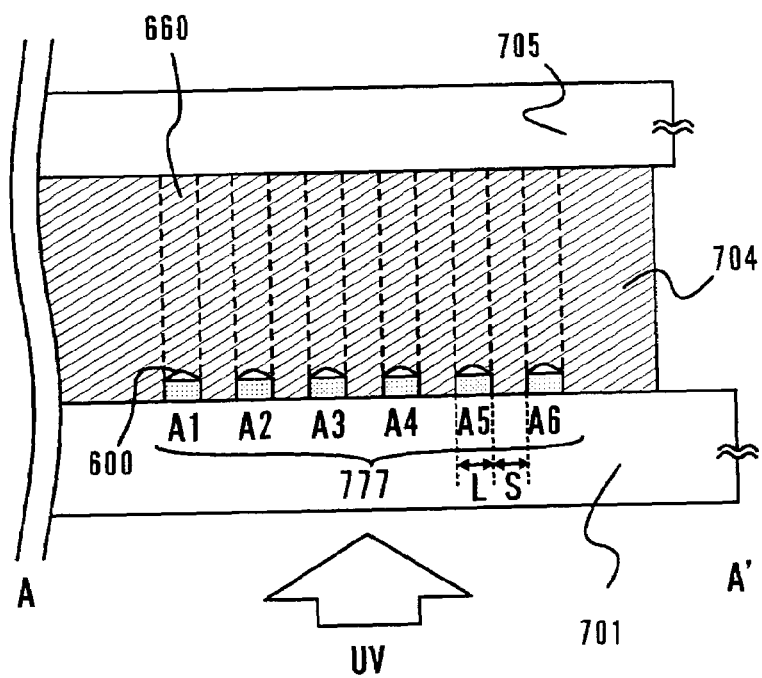

FIG. 3B is a sectional view taken along the line A–A' in FIG. 3A. In FIGS. 3A and 3B, the same reference symbols denote the same components.

When the irradiation of ultraviolet rays is made from the pixel substrate side in FIG. 3B, portions of the sealing member on the wiring lines A1 to A6, which are denoted by 660, are shaded. However, if a width L of each wiring line is sufficiently small and a spacing S between two wiring lines is large enough, the ultraviolet rays irradiated reach the shaded portions 660. Though portions 600 right on the wiring lines are not exposed to the ultraviolet rays, the portions 600 are small enough as compared with the case where the width of a wiring line is large and, overall, the sealing member can be exposed sufficiently.

Specifically, the width L of each of the wiring lines A1 to A6 is 100 μm to 200 μm whereas the spacing S between adjacent lines in the wiring lines A1 to A6 is 50 μm to 150 μm, and L/S is within 0.7 to 1.5. If wiring lines configured as above are used, the sealing member on these wiring lines is sufficiently exposed to ultraviolet rays through the wiring lines, so that the sealing member is cured satisfactorily.

More desirably, the width L of each of the wiring lines A1 to A6 is equal to or less than 150 μm whereas the spacing L between adjacent lines in the wiring lines A1 to A6 is equal to or more than 100 μm, and L/S is 1.5 or less. In this case, the sealing member on the wiring lines can be cured enough.

Although the one power line 777 is focused out of the wiring lines 710b in FIGS. 3A and 3B, a similar configuration can be applied to the other wiring lines formed in the sealed region which can cause a trouble if their width is set improperly.

Thus the wiring lines can be formed in the sealed region. This reduces the area of the regions other than the pixel portion, thereby making it possible to reduce the display device in size.

Embodiments of the present invention will be described below.

Embodiment 1

Figure 2A:
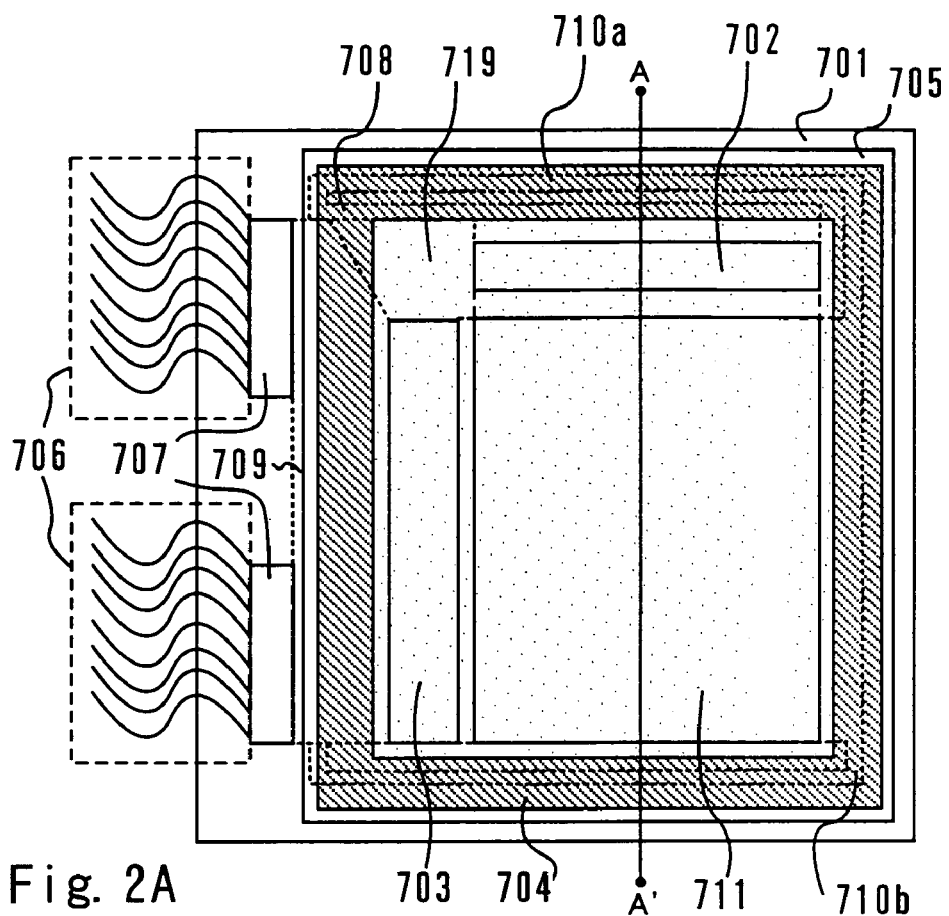
FIGS. 2A and 2B are a top view of an EL display device according to the present invention and a sectional view thereof, respectively.
Figure 2B:
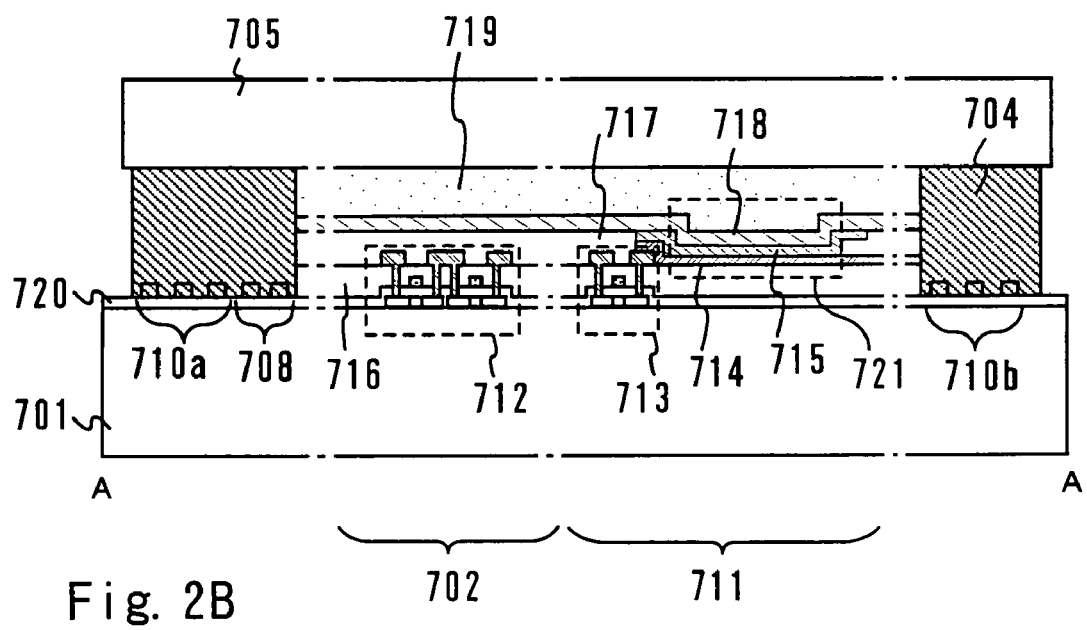

This embodiment gives a description with reference to FIGS. 2A and 2B on an active matrix EL display device having a structure different from the one shown in Embodiment Mode. Components identical with those in FIGS. 1A and 1B are denoted by the same reference symbols.

FIG. 2A is a top view of an EL display device according to the present invention. On a pixel substrate 701, a pixel portion 711, a gate signal line driving circuit 702, and a source signal line driving circuit 703 are formed. A sealing member 704 is formed surrounding the pixel portion and the driving circuits, so that a covering member 705 is bonded by the sealing member. FPC substrates 706 are connected to the top face of the pixel substrate 701 by external input terminals 707. Wiring lines 708 are a plurality of wiring lines such as signal lines and power supply lines, which receive signals from the FPC substrates 706 through the external input terminals 707 to transmit the signals to the gate signal line driving circuit 702. Wiring lines 709 are a plurality of wiring lines such as signal lines and power supply lines, which receive signals from the FPC substrates 706 through the external input terminals 707 to transmit the signals to the source signal line driving circuit 703. Wiring lines 710a and wiring lines 710b are a plurality of wiring lines such as power supply lines, which receive signals from the FPC substrates 706 through the external input terminals 707 to transmit the signals to the pixel portion 711. The wiring lines 708 to 710 are formed in the sealed region.

FIG. 2B is a sectional view taken along the line A–A' in FIG. 2A.

In order to simplify the illustration, components shown in FIG. 2B are limited to a TFT 712 as an element constituting the gate signal line driving circuit 702, and an EL driving TFT 713 and an EL element 721 as elements that constitute the pixel portion 711. Either a source region of the EL driving TFT 713 or a drain region thereof is connected to a pixel electrode 714 of the EL element 721 in order to control a current flowing into the EL element 721. Denoted by 716 in FIG. 2B is an interlayer insulating film, 715, an EL layer, 717, an insulating film, 718, an opposite electrode, 719, a filler, and 720, a gate insulating film. The interlayer insulating film 716 is formed of an organic material here.

The wiring lines 708 and the wiring lines 710a and 710b are formed from the same material that is used to form source wiring lines and drain wiring lines of the TFT 712 and of the EL driving TFT 713.

Of the wiring lines 708 to 710, explanations of the wiring lines 709 are omitted because the wiring lines 709 are formed in the same way as the wiring line 708 and the wiring lines 710a and 710b.

The interlayer insulating film 716 is formed of an organic material, and adhesion is poor between the organic material and the wiring lines 708 and the wiring lines 710a and 710b if they are formed directly on the organic material. Forming the wiring lines directly on the organic material also has a problem of degrading the wiring lines 708 and the wiring lines 710a and 710b, for impurities are introduced from the organic material to the material used to form the wiring lines 708 and the wiring lines 710a and 710b. For that reason, the wiring lines 708 and the wiring lines 710a and 710b have to be formed after removing the interlayer insulating film 716 formed of an organic material.

The step of removing the interlayer insulating film 716 from a part where the wiring lines 708 and the wiring lines 710a and 710b are to be formed can be carried out when source wiring lines and drain wiring lines of the TFT 712 and the pixel TFT 713 are formed and contact holes reaching source regions of the TFTs 712 and 713 are formed.

The sealing member 704 is often formed from a UV-curable material. A material often used for the covering member 705 is a material having a light-shielding property. Therefore the sealing member 704 cannot be cured when the sealing member 704 is irradiated with ultraviolet rays from the covering member side. Thus the irradiation of ultraviolet rays has to be made from the pixel substrate 701 side through the wiring lines 708 and the wiring lines 710a and 710b to cure the sealing member 704. However, if a wide wiring line is used for the wiring lines 708 and the wiring lines 710a and 710b, portions of the sealing member 704 which are shaded by the wiring lines cannot receive a sufficient amount of ultraviolet irradiation. Then the possibility is that the sealing member 704 is not cured satisfactorily.

Accordingly, this embodiment does not use a single wide wiring line for the wiring lines 708 and the wiring lines 710a and 710b. Employed instead are a plurality of wiring lines connected in parallel to one another as shown in FIGS. 3A and 3B.

Specifically, the width L of each of the plural wiring lines is 100 μm to 200 μm whereas the spacing S between adjacent lines in the plural wiring lines is 50 μm to 150 μm, and the ratio of the width L of each of the plural wiring lines to the spacing S between adjacent lines in the plural wiring lines, namely, L/S is within 0.7 to 1.5. If wiring lines configured as above are used, the sealing member on these wiring lines is sufficiently exposed to ultraviolet rays through the wiring lines, so that the sealing member is cured satisfactorily.

More desirably, the width L of each of the plural wiring lines is equal to or less than 150 μm whereas the spacing S between adjacent lines in the plural wiring lines is equal to or more than 100 μm, and L/S is 1.5 or less. In this case, the sealing member on the wiring lines can be cured enough.

Thus the wiring lines can be formed in the sealed region. This reduces the area of the regions other than the pixel portion, thereby making it possible to reduce the display device in size.

Embodiment 2

This embodiment describes a wiring example of power supply lines for supplying current to power supply lines for a pixel portion of an active matrix EL display device.

Reference is again made to FIG. 1A. A current for driving the EL element 721 flows through the power supply lines of the wiring lines 710a and 710b to be inputted to the power supply lines for the pixel portion 711. The power supply lines for the pixel portion 711 are supplied with current from two sources, namely, from the power supply lines of the wiring lines 710a and from the power supply lines of the wiring lines 710b.

Figure 4A:
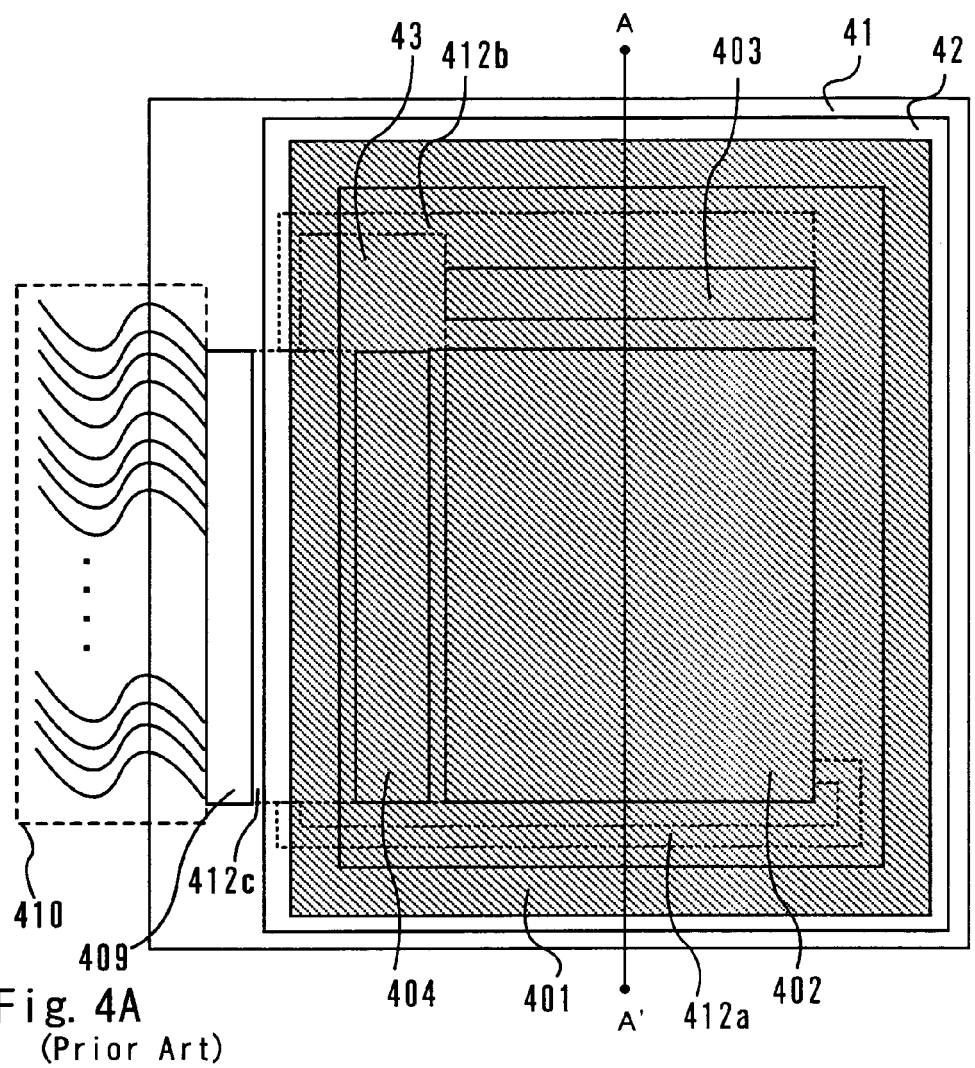
FIGS. 4A and 4B are a top view of a conventional EL display device and a sectional view thereof, respectively.
Figure 4B:
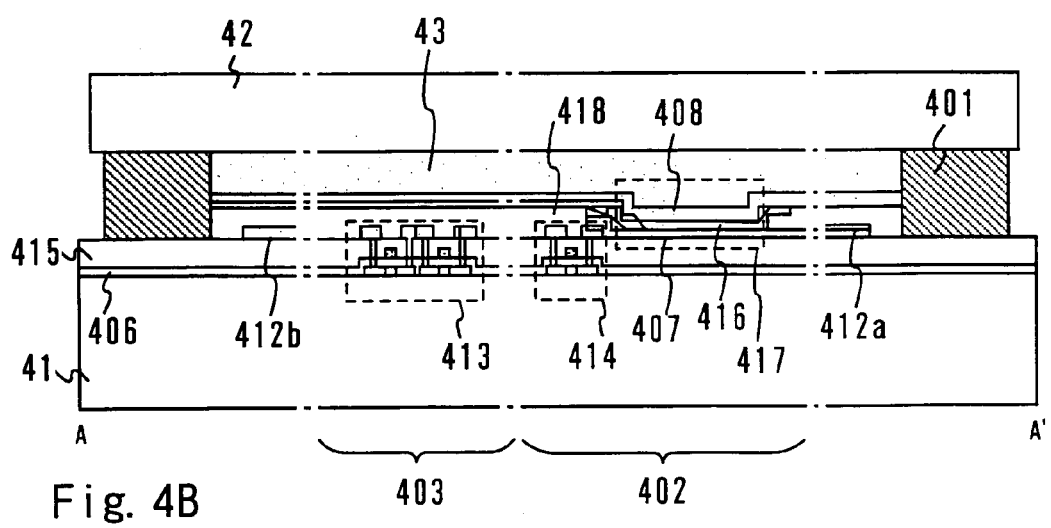

On the other hand, in the conventional EL display device shown in FIGS. 4A and 4B, the power supply lines for the pixel portion 402 is supplied with current from one source, namely, from the power supply lines of the wiring lines 412a. Following is the reason why the pixel portion of the active matrix EL display device according to the present invention is supplied with current at two points in the pixel portion.

Figure 5A:
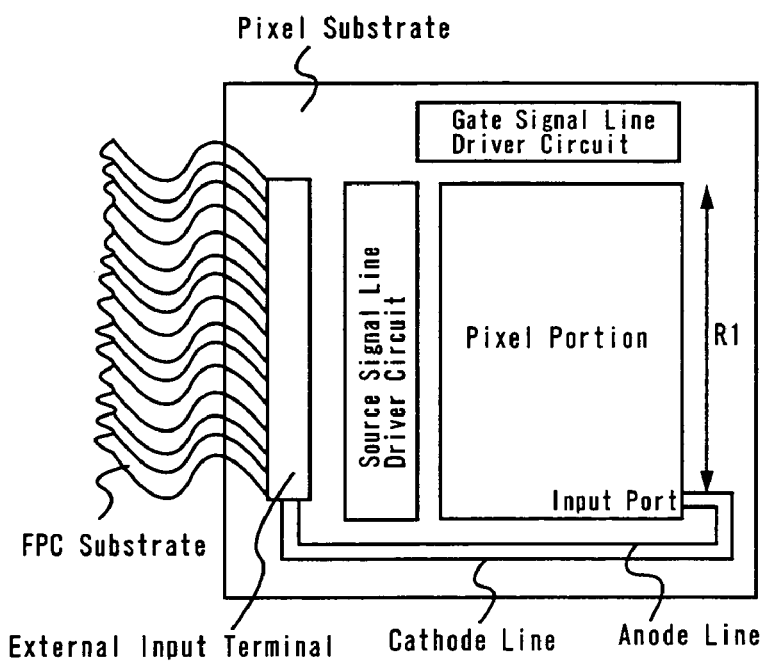
FIGS. 5A and 5B are wiring diagrams of power supply lines in a display device according to the present invention.
Figure 5B:
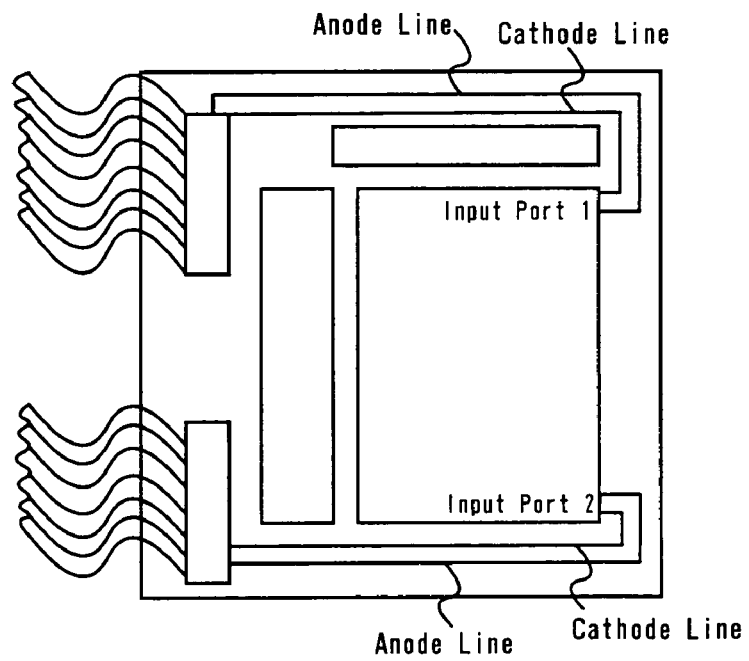

FIGS. 5A and 5B schematically illustrate wiring examples for the power supply lines. Shown in FIG. 5A is a case where one external input terminal connected to one FPC substrate is provided to supply current to the pixel portion at one point in the pixel portion. FIG. 5B shows a case where an external input terminal is divided into two each connected to an FPC substrate (a first FPC substrate and a second FPC substrate) and provided in different places to supply current to the pixel portion at two points in the pixel portion. Shown as the power supply lines are anode lines connected to the anodes of the EL elements and cathode lines connected to the cathodes thereof. In FIG. 5A, one external input terminal 707 is provided. In FIG. 5B, on the other hand, the external input terminal 707 is divided into two so that two parts are provided in different places (near one end of a longer side of the substrate and near the other end of the longer side of the substrate) and a set of anode lines and cathode lines connects one part with the pixel portion while the other set of anode lines and cathode lines connects the other part with the pixel portion.

In FIG. 5A, the power supply lines on the far side of the input port of the anode lines and the cathode lines have an wiring resistance increased in accordance with a length R1. With the wiring resistance increased, the electric potential declines and hence the voltage applied to the EL elements by the power supply lines is lowered, thereby inviting reduction in image quality.

On the other hand, in FIG. 5B, there are an input port 1 of the anode lines and the cathode lines and an input port 2 that is provided apart from the input port 1. The power supply lines are thus receive current both from the input port 1 and from the input port 2. This prevents voltage reduction due to increase in wiring resistance, whereby degradation of image quality can be controlled.

When the external input terminal is divided to be provided in two places as in FIG. 5B, the distance between two external input terminal parts is set to equal to or more than half the length of the longer side of the substrate on which the pixel portion is formed. This enhances the effect of controlling the degradation of image quality caused by voltage reduction due to the increase in wiring resistance.

The external input terminal may be provided in one place without dividing it if an increase in wiring resistance is ignorable, or does not matter.

This embodiment can be carried out in combination with Embodiment Mode or Embodiment 1.

Embodiment 3

Described in this embodiment is a liquid crystal display device adopting the method of forming wiring lines in a sealed region.

The liquid crystal display device is driven by the active matrix method, for example.

Figure 10:
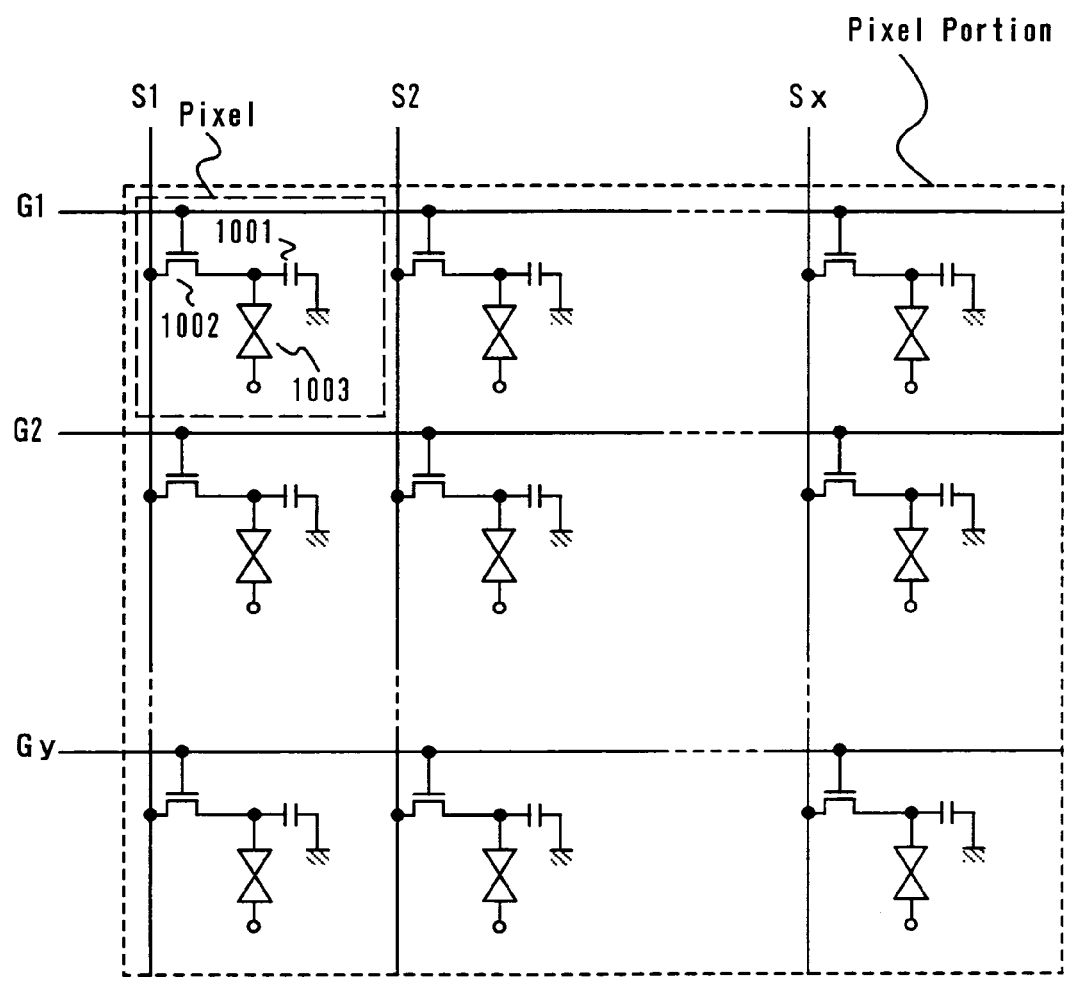
FIG. 10 is a diagram showing the structure of a pixel portion in a liquid crystal display device.

First, the structure of a pixel portion in the active matrix liquid crystal display device is shown in FIG. 10. In the active matrix liquid crystal display device, each pixel has TFTs. Each pixel has a pixel TFT 1002 whose gate electrode is connected to one of gate signal lines (G1 to Gy) for receiving a selection signal from a gate signal line driving circuit. The pixel TFT 1002 in each pixel has a source region and a drain region one of which is connected to one of source signal lines (S1 to Sx) for receiving a signal from a source signal line driving circuit and the other of which is connected to one of electrodes of a capacitor storage 1001 and to one of two electrodes sandwiching a liquid crystal 1003.

When a signal is inputted to the gate signal line G1, the signal is inputted to the gate electrode of every pixel TFT 1002 that is connected to the gate signal line G1 to turn these pixel TFTs ON. If a signal is inputted from the source signal lines (S1 to Sx) to a pixel whose pixel TFT 1002 is turned ON, an electric charge is held in the capacitor storage 1001. With the electric charge held in the capacitor storage, a voltage is applied to the electrodes sandwiching the liquid crystal 1003. The applied voltage is used to control the orientation of liquid crystal molecules, thereby controlling the amount of transmitting light. This operation is repeated for all of the gate signal lines (G1 to Gy) to display an image.

Next, sealing of the liquid crystal in the active matrix liquid crystal display device will be described.

The liquid crystal display device displays an image by controlling the orientation of liquid crystal through application of voltage to the two electrodes sandwiching the liquid crystal. In order to keep the liquid crystal sandwiched between the electrodes, the liquid crystal has to be sealed in a space between two insulating substrates which respectively have electrodes and which are adhered to each other by a sealing member in a manner that makes their electrodes face each other.

Figure 6A:
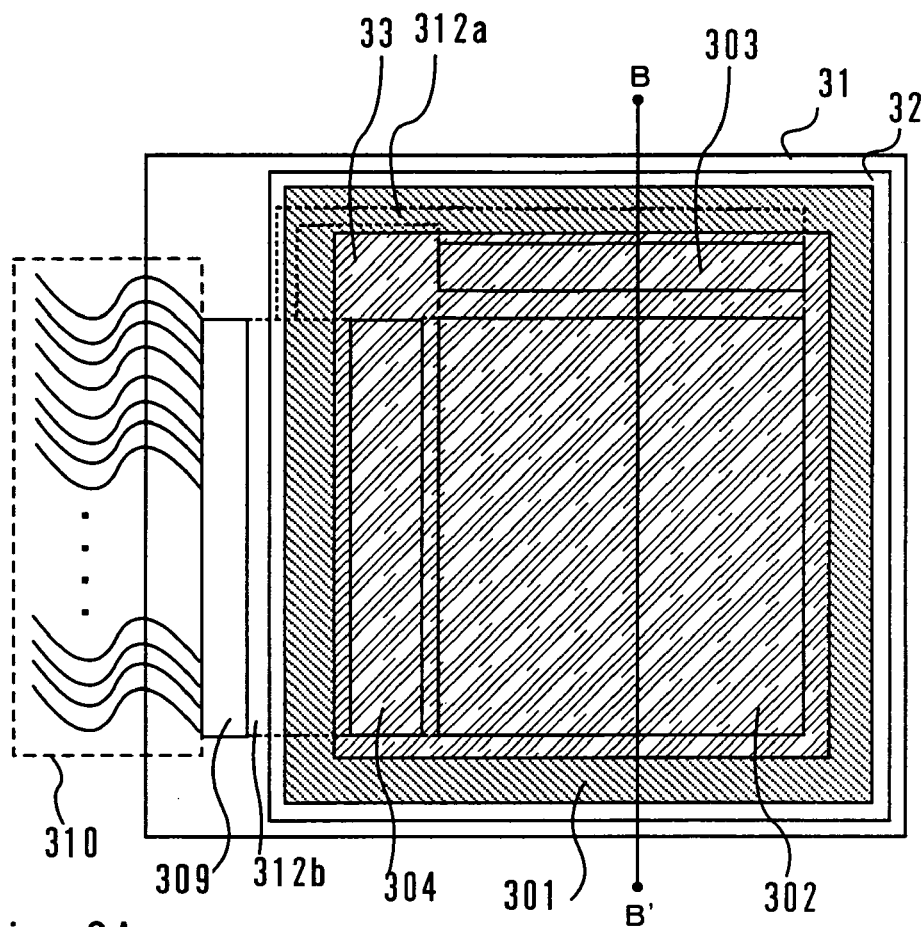
FIGS. 6A and 6B are a top view of a liquid crystal display device according to the present invention and a sectional view thereof, respectively.
Figure 6B:
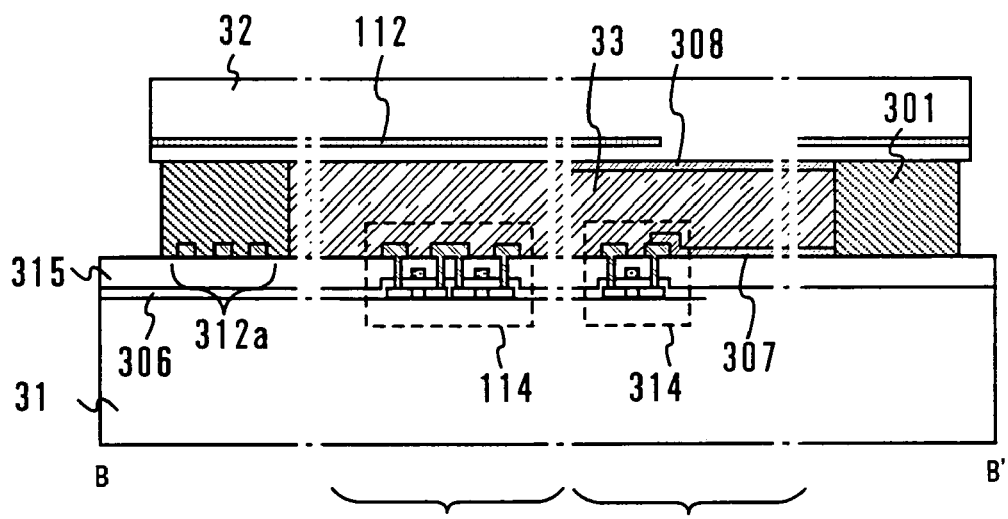

FIGS. 6A and 6B show in schematic diagrams the two substrates of the liquid crystal display device with the liquid crystal sealed therebetween.

FIG. 6A is a top view of the liquid crystal display device. An epoxy resin is used for a sealing member 301. An orientation film (not shown) is formed on a substrate 31 and subjected to rubbing treatment. On the substrate 31, the sealing member 301 is formed surrounding a pixel portion 302, a gate signal line driving circuit 303, and a source signal line driving circuit 304. At this point, an opening (not shown) is formed in a part of the sealing member 301 as an inlet for injecting the liquid crystal later. Then a spacer (not shown) is sprayed and the substrate 31 is bonded to another substrate 32.

The diameter of the spacer determines the distance between the substrate 31 and the substrate 32. After the distance is fixed, the substrate 31 is adhered to the substrate 32 by curing the sealing member 301 with irradiation of ultraviolet rays through the substrate 31 or the substrate 32, or heating.

When the sealing member 301 is cured by heating in order to bond the substrate 31 to the substrate 32, the heat treatment has to be performed while pressurizing. This method causes the substrate 31 and the substrate 32 to thermally expand and the displacement in bonding the substrates is a serious problem. Thermal curing also takes a longer time. Therefore, the sealing member is often cured by irradiation of ultraviolet rays rather than thermally cured.

Thereafter, a liquid crystal 33 is injected from the liquid crystal inlet, which is closed by an end-sealing material (not shown) so that the liquid crystal 33 does not leak to the exterior thereof. The end-sealing material is a UV-curable material, not a thermally curable material. This is because the liquid crystal 33 is degraded if the device is heated after the liquid crystal 33 is injected.

The sealing member 301 and the end-sealing material also serve to block the passage of substances that contaminate the liquid crystal, such as moisture containing ions.

Described next are wiring lines for transmitting signals to be inputted respectively to the source signal line driving circuit and the gate signal line driving circuit.

Video signals or other signals from the external are inputted to the gate signal line driving circuit 303 and the source signal line driving circuit 304 to constitute signals that are to be inputted to the pixel portion 302. The signals to be inputted to the gate signal line driving circuit 303 and the source signal line driving circuit 304 from the external are inputted by an FPC substrate 310 bonded to an external input terminal 309 that is placed on the pixel substrate 31. The FPC substrate 310 is connected at the external input terminal 309 through an anisotropic conductive film (not shown) to wiring lines 312 that are formed on the pixel substrate. The wiring lines 312 (312a, 312b, and 312c) run in the sealing member 301 to be connected to the gate signal line driving circuit 303 and the source signal line driving circuit 304.

The wiring lines 312a are wiring lines that receive signals from the FPC substrate 310 through the external input terminal 309 to transmit the signals to the gate signal line driving circuit 303. The wiring lines 312b are wiring lines that receive signals from the FPC substrate 310 through the external input terminal 309 to transmit the signals to the source signal line driving circuit 304. The wiring lines 312a and 312b are formed in a part of the pixel substrate 31 which is covered by the sealing member 301 (the sealed region).

FIG. 6B is a sectional view taken along the line B–B' in FIG. 6A. The same components are denoted by the same reference symbols in FIGS. 6A and 6B.

In order to simplify the illustration, components shown in FIG. 6B are limited to a TFT 114 constituting the gate signal line driving circuit 303, and a pixel TFT 314 constituting the pixel portion 302. The substrate 31 on which the TFTs constituting the pixel portion and the driving circuits are formed is referred to as pixel substrate. An electrode 307 set on the pixel substrate is referred to as pixel electrode. The other substrate, 32, is called an opposite substrate. An electrode 308 set on the opposite substrate side is called an opposite electrode. The voltage applied to the pixel electrode 307 and the opposite electrode 308 is controlled to display an image.

Denoted by 306 in FIG. 6B is a gate insulating film of each of the TFT 114 and the pixel TFT 314. Reference symbol 315 denotes an interlayer insulating film and 112 denotes a light-shielding layer. The orientation film is not shown in FIG. 6B.

The pixel TFT 314 has a source region and a drain region one of which is connected to the pixel electrode 307 to control the voltage applied to the pixel electrode 307. The interlayer insulating film 315 is formed of an inorganic material here.

The wiring lines 312 are formed from the same material that is used to form source wiring lines and drain wiring lines of the TFT 114 and of the pixel TFT 314.

Assuming that the sealing member 301 is formed from a UV-curable material, the sealing member 301 cannot be cured when the sealing member 301 is irradiated with ultraviolet rays from the opposite substrate 32 side because of the light-shielding layer 112. Thus the irradiation of ultraviolet rays has to be made from the pixel substrate 31 side through the wiring lines 312a to cure the sealing member 301. However, if a wide wiring line is used for the wiring lines 312a, portions of the sealing member 301 which are shaded by the wiring lines cannot receive a sufficient amount of ultraviolet irradiation. Then the possibility is that the sealing member 301 is not cured satisfactorily.

Accordingly, this embodiment does not use a single wide wiring line for the wiring lines 312a. Employed instead are a plurality of wiring lines connected in parallel to one another as shown in FIGS. 3A and 3B.

Specifically, the width L of each of the plural wiring lines is 100 μm to 200 μm whereas the spacing S between adjacent lines in the plural wiring lines is 50 μm to 150 μm, and the ratio of the width L of each of the plural wiring lines to the spacing S between adjacent lines in the plural wiring lines, namely, L/S, is within 0.7 to 1.5. If wiring lines configured as above are used, the sealing member on these wiring lines is sufficiently exposed to ultraviolet rays through the wiring lines, so that the sealing member is cured satisfactorily.

More desirably, the width L of each of the plural wiring lines is equal to or less than 150 µm whereas the spacing S between adjacent lines in the plural wiring lines is equal to or more than 100 µm, and L/S is 1.5 or less. In this case, the sealing member on the wiring lines can be cured enough.

If the light-shielding layer 112 is formed on the pixel substrate 31 side, the irradiation of ultraviolet rays has to be made from the opposite substrate 32 side to cure the sealing member 301. In this case, the wiring lines 312a do not block the ultraviolet rays irradiated, and hence a wide wiring line may be used as 312a.

Thus the wiring lines can be formed in the sealed region. This reduces the area of the regions other than the pixel portion, thereby making it possible to reduce the display device in size.

Embodiment 4

Figure 7A:
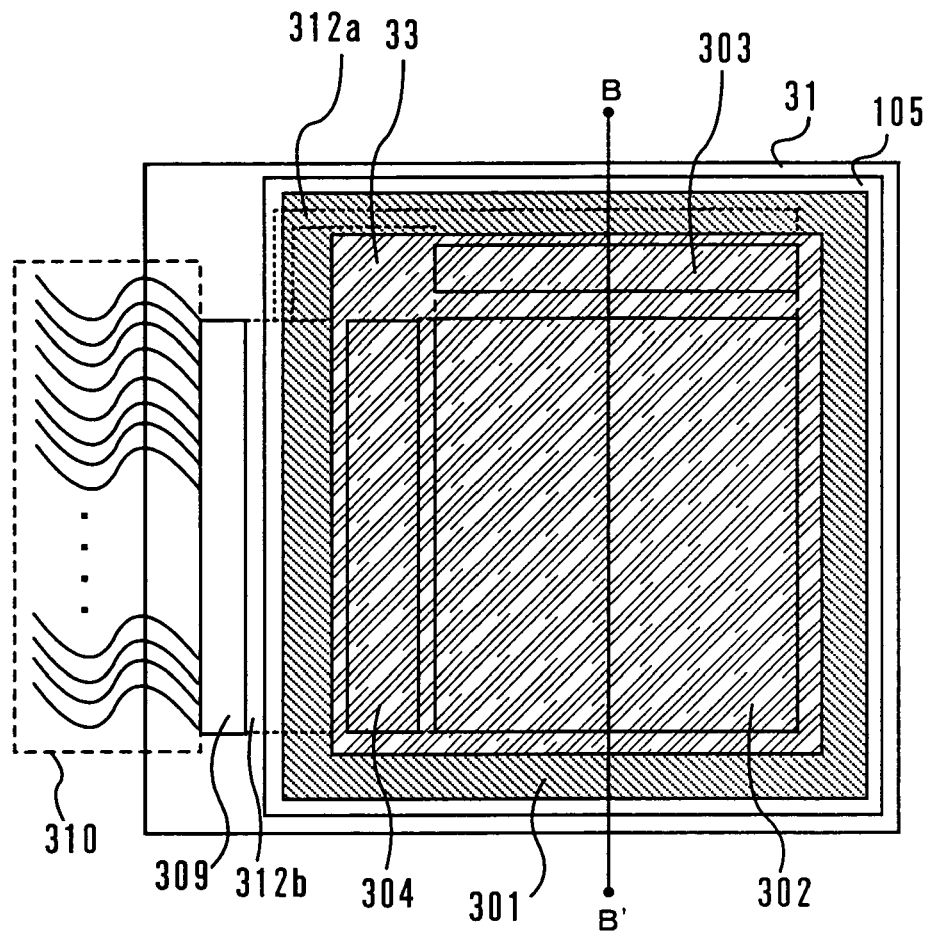
FIGS. 7A and 7B are a top view of a liquid crystal display device according to the present invention and a sectional view thereof, respectively.
Figure 7B:
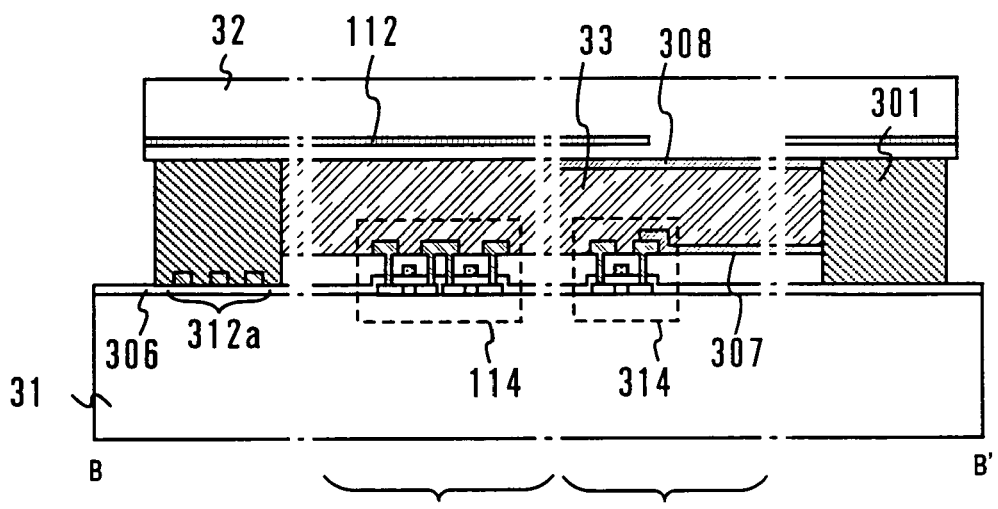

A description given in this embodiment with reference to FIGS. 7A and 7B is about a display device having a structure different from the one described in Embodiment 3. Components in FIGS. 7A and 7B that are identical with those in FIGS. 6A and 6B are denoted by the same reference symbols.

FIG. 7A is a top view of a liquid crystal display device according to the present invention. On a pixel substrate 31, a pixel portion 302, a gate signal line driving circuit 303, and a source signal line driving circuit 304 are formed. A sealing member 301 is formed surrounding the pixel portion and the driving circuits, so that an opposite substrate 32 is bonded to the substrate 31 and a liquid crystal 33 is sealed therebetween. An FPC substrate 310 is connected to the top face of the pixel substrate 31 by an external input terminal 309. Wiring lines 312a are wiring lines that receive signals from the FPC substrate 310 through the external input terminal 309 to transmit the signals to the gate signal line driving circuit 303. Wiring lines 312b are wiring lines that receive signals from the FPC substrate 310 through the external input terminal 309 to transmit the signals to the source signal line driving circuit 304. The wiring lines 312a and 312b are formed in the sealed region.

FIG. 7B is a sectional view taken along the line B–B' in FIG. 7A. The same components are denoted by the same reference symbols in FIGS. 7A and 7B.

In order to simplify the illustration, components shown in FIG. 7B are limited to a TFT 114 as an element constituting the gate signal line driving circuit 303, and a pixel TFT 314 as an element constituting the pixel portion 302. The pixel TFT 314 has a source region and a drain region one of which is connected to a pixel electrode 307 to control the voltage applied to the pixel electrode 307.

The wiring lines 312 are formed from the same material that is used to form source wiring lines and drain wiring lines of the TFT 114 and of the pixel TFT 314. An interlayer insulating film 315 is formed of an organic material here.

The interlayer insulating film 315 is formed of an organic material, and adhesion is poor between the organic material and the wiring lines 312 if they are formed directly on the organic material. Forming the wiring lines directly on the organic material also has a problem of degrading the wiring lines 312, for impurities are introduced from the organic material to the material used to form the wiring lines 312. For that reason, the wiring lines 312 have to be formed after removing the interlayer insulating film 315 formed of an organic material.

The step of removing the interlayer insulating film 315 from a part where the wiring lines 312a are to be formed can be carried out when the source wiring lines and the drain wiring lines of the TFT 114 and the pixel TFT 314 are formed and contact holes reaching source regions or drain regions of the TFTs 114 and 314 are formed.

Assuming that the sealing member 301 is formed from a UV-curable material, the sealing member 301 cannot be cured when the sealing member 301 is irradiated with ultraviolet rays from the opposite substrate 32 side because of the light-shielding layer 112. Thus the irradiation of ultraviolet rays has to be made from the pixel substrate 31 side through the wiring lines 312a to cure the sealing member 301. However, if a wide wiring line is used for the wiring lines 312a, portions of the sealing member 301 which are shaded by the wiring lines cannot receive a sufficient amount of ultraviolet irradiation. Then the possibility is that the sealing member 301 is not cured satisfactorily.

Accordingly, this embodiment does not use a single wide wiring line for the wiring lines 312a. Employed instead are a plurality of wiring lines connected in parallel to one another as shown in FIGS. 3A and 3B.

Specifically, the width L of each of the plural wiring lines is 100 µm to 200 µm whereas the spacing S between adjacent lines in the plural wiring lines is 50 µm to 150 µm, and the ratio of the width L of each of the plural wiring lines to the spacing S between adjacent lines in the plural wiring lines, namely, L/S, is within 0.7 to 1.5. If wiring lines configured as above are used, the sealing member on these wiring lines is sufficiently exposed to ultraviolet rays through the wiring lines, so that the sealing member is cured satisfactorily.

More desirably, the width L of each of the plural wiring lines is equal to or less than 150 µm whereas the spacing S between adjacent lines in the plural wiring lines is equal to or more than 100 µm, and L/S is 1.5 or less. In this case, the sealing member on the wiring lines can be cured enough.

If the light-shielding layer 112 is formed on the pixel substrate 31 side, the irradiation of ultraviolet rays has to be made from the opposite substrate 32 side to cure the sealing member 301. In this case, the wiring lines 312a do not block the ultraviolet rays irradiated, and hence a wide wiring line may be used as 312a.

Thus the wiring lines can be formed in the sealed region. This reduces the area of the regions other than the pixel portion, thereby making it possible to reduce the display device in size.

Embodiment 5

The electronic equipments, which incorporate the electronic display device manufactured by applying the present invention as the display medium, are explained below.

Such electronic equipments include a video camera, a digital camera, a head mounted display (goggle type display), a game machine, a car navigation system, a personal computer, a portable information terminal (a mobile computer, a portable telephone, an electronic book and the like) and the like. Examples of those are shown in FIG. 8.

Figure 8A:
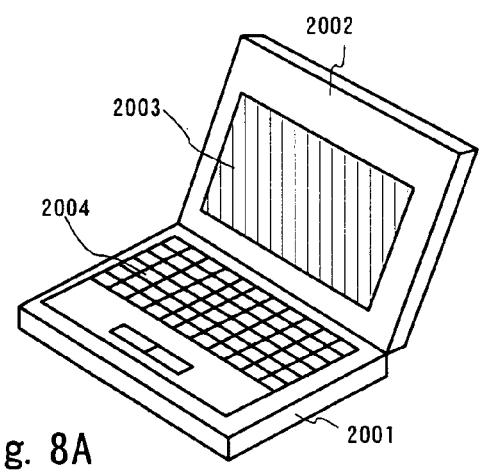
FIGS. 8A to 8E are diagrams showing electronic equipment that employs a display device of the present invention.

FIG. 8A shows a personal computer, which contains a main body 2001, a casing 2002, a display portion 2003, a keyboard 2004 and the like. The display device of the present invention can be used in the display portion 2003 of the personal computer.

Figure 8B:
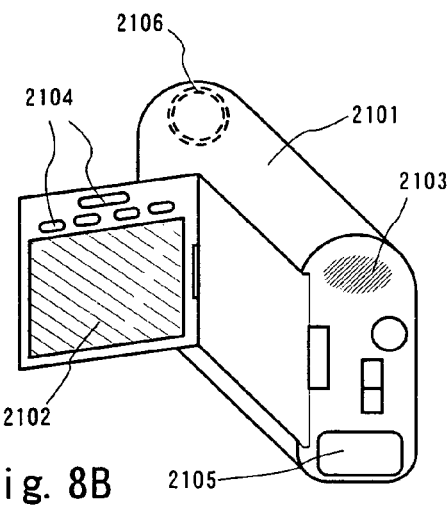

FIG. 8B shows a video camera, which contains a main body 2101, a display portion 2102, a sound input portion 2103, operation switches 2104, a battery 2105, an image receiving portion 2106 and the like. The display device of the present invention can be used in the display portion 2102 of the video camera.

Figure 8C:
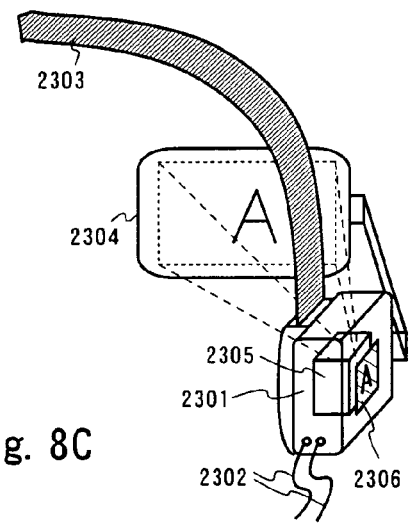
Figure 8D:
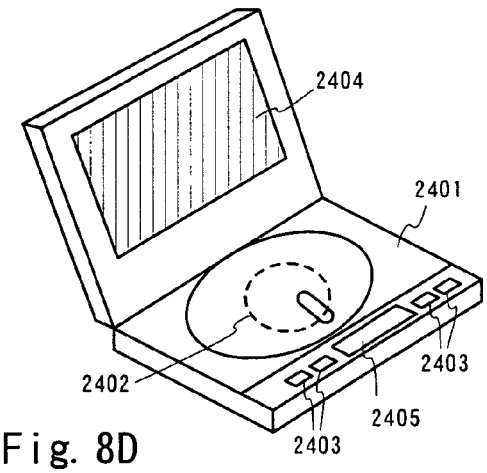

FIG. 8C shows a portion (right side) of a head mounted type display device, which contains a main body 2301, a signal cable 2302, a head fixing band 2303, a screen monitor 2304, an optical system 2305, a display portion 2306 and the like. The display device of the present invention can be used in the display portion 2306 of the head mounted type display device, FIG. 8D shows an image playback device equipped with a recording medium (specifically, a DVD playback device), which contains a main body 2401, a recording medium (such as a CD, an LD or a DVD) 2402, operation switches 2403, a display portion (a) 2404, a display portion (b) 2405 and the like. The display portion (a) is mainly used for displaying image information. The display portion (b) is mainly used for displaying character information. The display device of the present invention can be used in the display portions (a) and (b) of the image playback device equipped with the recording medium. Note that the present invention can be applied to devices such as a CD playback device and a game machine as the image playback device equipped with the recording medium.

Figure 8E:
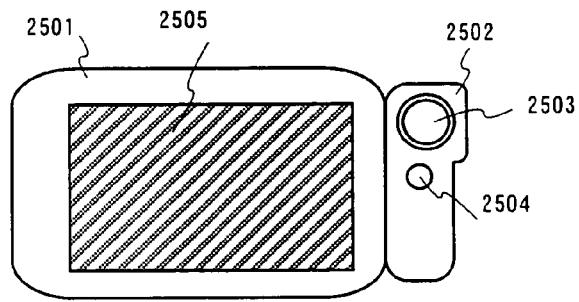
Figure 9:
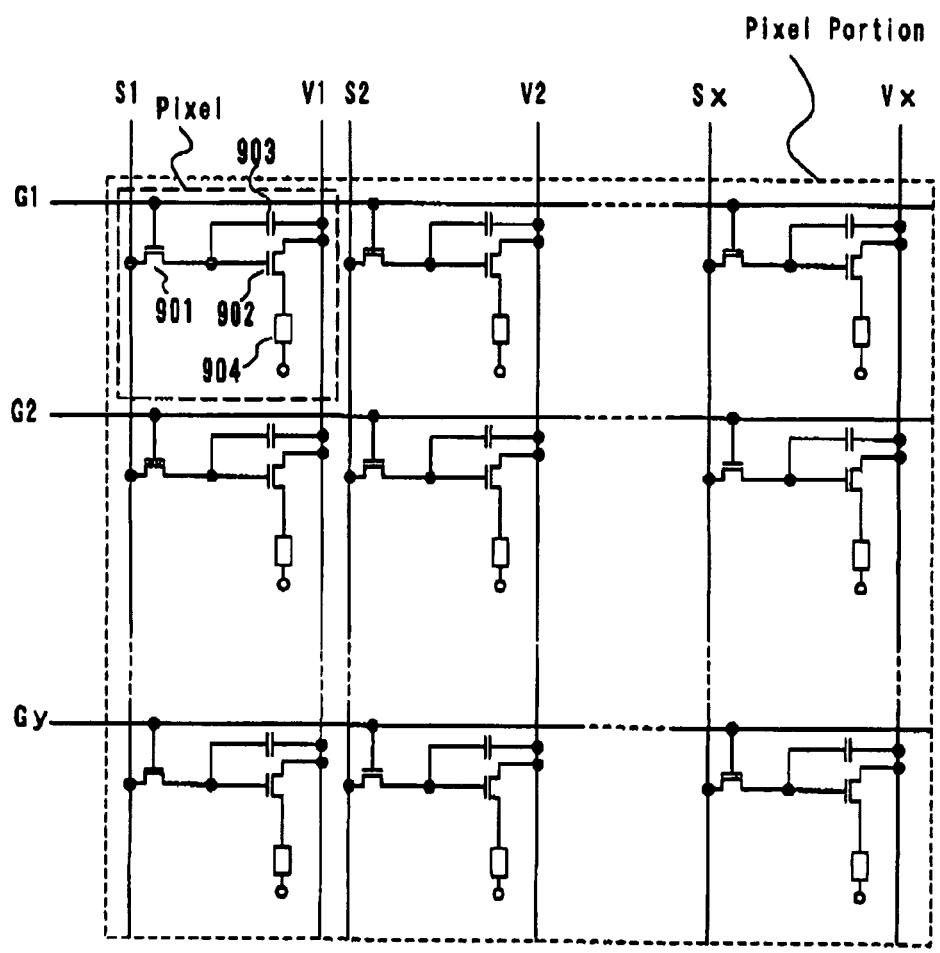
FIG. 9 is a diagram showing the structure of a pixel portion in an EL display device.

FIG. 8E shows a mobile computer, which contains a main body 2501, a camera portion 2502, an image receiving portion 2503, operation switches 2504, a display portion 2505 and the like. The display device of the present invention can be used in the display portion 2505 of the mobile computer.

The applicable range of the present invention is extremely wide, as shown above, and it is possible to apply the present invention to electronic equipments in all fields. Further, the electronic equipments of this embodiment can be realized using the constitution in which Embodiments 1 to 4 are freely combined.

In display devices such as EL display devices and liquid crystal display devices, portions that do not display an image, including the periphery of driving circuits where wiring lines are formed and a portion where the sealing member is formed, take up a large area to hinder the display devices from reducing their sizes.

With the structures described above, the present invention is capable of forming wiring lines in the portion where the sealing member is formed instead of the periphery of the driving circuits. Thus the invention can provide a small-sized display device.

What is claimed is:

1. A display device comprising:
pixels that each have an EL element and are formed over a substrate;
a driver circuit for inputting a signal to said pixels and formed over said substrate;
a covering member having a light-shielding property; and
a sealing member comprising a UV-curable material, said sealing member surrounding said pixels and said driver circuit,
wherein:
said substrate is adhered to said covering member with said sealing member sandwiched therebetween to seal said EL element,
first wiring lines for inputting an external signal to said driver circuit are formed between said sealing member and said substrate,
said first wiring lines each have second wiring lines connected in parallel to one another; and
the width of each of said second wiring lines connected in parallel to one another, given as L, is 100 μm to 200 μm, and
the spacing between adjacent ones of the second wiring lines connected in parallel to one another given as S, is 50 μm to 150 μm.

2. A display device according to in claim 1, wherein said sealing member is in contact with an inorganic layer formed over said substrate.

3. A display device according to claim 1, wherein the width of each of said second wiring lines connected in parallel to one another is given as L, the spacing between adjacent ones of the second wiring lines connected in parallel to one another is given as S, and the ratio of L to S (L/S) is within 0.7 to 1.5.

4. A display device according to claim 1, wherein said plural first wiring lines are formed from the same material that is used to form source wiring lines and drain wiring lines to TFTs for said pixels and for said driving circuit.

5. A video camera comprising a display device according to claim 1.

6. An image reproducing device comprising a display device according to claim 1.

7. A head mounted display comprising a display device according to claim 1.

8. A cellular phone comprising a display device according to claim 1.

9. A portable information terminal comprising a display device according to claim 1.

10. A display device comprising:
a first substrate having pixels formed over the first substrate;
a driving circuit for inputting a signal to said pixels and formed over said first substrate;
a second substrate having a light-shielding property; and
a sealing member comprising a UV-curable material, said sealing member surrounding said pixels and said driving circuit,
wherein:
said first substrate is adhered to said second substrate with said sealing member sandwiched therebetween and with a liquid crystal sealed in a region enclosed by said first substrate, said second substrate, and said sealing member,
first wiring lines for inputting an external signal to said driving circuit are formed between said sealing member and said substrate,
said first wiring lines each have second wiring lines connected in parallel to one another, and
the width of each of said second wiring lines connected in parallel to one another, given as L, is 100 μm to 200 μm, and
the spacing between adjacent ones of the second wiring lines connected in parallel to one another given as S, is 50 μm to 150 μm.

11. A display device according to claim 10, wherein said sealing member is in contact with an inorganic layer formed over said first substrate.

12. A display device according to claim 10, wherein the width of each of said second wiring lines connected in parallel to one another is given as L, the spacing between adjacent ones of the second wiring lines connected in parallel to one another is given as S, and the ratio of L to S (L/S) is within 0.7 to 1.5.

13. A display device according to claim 10, wherein said plural first wiring lines are formed from the same material that is used to form source wiring lines and drain wiring lines to TFTs for said pixels and for said driving circuit.

14. A video camera comprising a display device according to claim 10.

15. An image reproducing device comprising a display device according to claim 10.

16. A head mounted display comprising a display device according to claim 10.

17. A cellular phone comprising a display device according to claim 10.

18. A portable information terminal comprising a display device according to claim 10.

19. A display device comprising:
a substrate;
a plurality of pixels formed over said substrate;
a driver circuit for inputting a signal to said pixels and formed over said substrate;
first wiring lines for inputting an external signal to said driver circuit formed over said substrate;
a covering member having a light-shielding property; and
a sealing member, wherein:
said plural pixels formed over said substrate are sealed by said sealing member and said covering member;
said first wiring lines are covered with said sealing member;
said sealing member includes a UV-curable material;
said first wiring lines each have a plurality of second wiring lines connected in parallel to one another; and
the width of each of said second wiring lines connected in parallel to one another, given as L, is 100 µm to 200 µm, and
the spacing between adjacent ones of the second wiring lines connected in parallel to one another given as S, is 50 µm to 150 µm.

20. A video camera comprising a display device according to claim 19.

21. An image reproducing device comprising a display device according to claim 19.

22. A head mounted display comprising a display device according to claim 19.

23. A cellular phone comprising a display device according to claim 19.

24. A portable information terminal comprising a display device according to claim 19.

25. A display device comprising:
a substrate;
a plurality of pixels formed over said substrate;
a driver circuit for inputting a signal to said pixels and formed over said substrate;
first wiring lines for inputting an external signal to said driver circuit formed over said substrate;
a covering member having a light-shielding property; and
a sealing member, wherein:
said plural pixels formed over said substrate are sealed by said sealing member and said covering member;
said plural pixels each have an EL element;
said first wiring lines are covered with said sealing member;
said sealing member includes a UV-curable material;
said first wiring lines each have a plurality of second wiring lines connected in parallel to one another; and
the width of each of said second wiring lines connected in parallel to one another, given as L, is 100 µm to 200 µm, and
the spacing between adjacent ones of the second wiring lines connected in parallel to one another given as S, is 50 µm to 150 µm.

26. A video camera comprising a display device according to claim 25.

27. An image reproducing device comprising a display device according to claim 25.

28. A head mounted display comprising a display device according to claim 25.

29. A cellular phone comprising a display device according to claim 25.

30. A portable information terminal comprising a display device according to claim 25.

31. A display device comprising:
a substrate;
a plurality of pixels formed over said substrate;
a driver circuit for inputting a signal to said pixels and formed over said substrate;
first wiring lines for inputting an external signal to said driver circuit formed over said substrate;
a covering member having a light-shielding property;
a sealing member; and a liquid crystal, wherein:
said plural pixels formed over said substrate and said liquid crystal are sealed by said sealing member and said covering member;
said first wiring lines are covered with said sealing member;
said sealing member includes a UV-curable material;
said first wiring lines each have a plurality of second wiring lines connected in parallel to one another; and
the width of each of said second wiring lines connected in parallel to one another, given as L, is 100 µm to 200 µm, and
the spacing between adjacent ones of the second wiring lines connected in parallel to one another given as S, is 50 µm to 150 µm.

32. A video camera comprising a display device according to claim 31.

33. An image reproducing device comprising a display device according to claim 31.

34. A head mounted display comprising a display device according to claim 31.

35. A cellular phone comprising a display device according to claim 31.

36. A portable information terminal comprising a display device according to claim 31.

* * * * *